United States Patent
Li et al.

(10) Patent No.: US 7,906,415 B2
(45) Date of Patent: Mar. 15, 2011

(54) DEVICE HAVING ZINC OXIDE SEMICONDUCTOR AND INDIUM/ZINC ELECTRODE

(75) Inventors: Yuning Li, Mississauga (CA); Beng S. Ong, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 11/495,345

(22) Filed: Jul. 28, 2006

(65) Prior Publication Data

US 2008/0023698 A1  Jan. 31, 2008

(51) Int. Cl.
*H01L 21/20* (2006.01)

(52) U.S. Cl. ........ 438/488; 438/104; 438/150; 438/166; 438/198; 257/43; 257/64; 257/66; 257/E29.004

(58) Field of Classification Search .......... 438/149, 438/104, 166, 150, 151, 168, 187, 198, 488; 338/21; 257/43, 66, 64, 75, 627, E33.003, 257/E31.04, E29.003, E29.004, E21.572
See application file for complete search history.

(56) References Cited

U.S. PATENT DOCUMENTS

| 3,728,008 | A | * | 4/1973 | Allan et al. | 349/131 |
|---|---|---|---|---|---|
| 5,699,035 | A | * | 12/1997 | Ito et al. | 338/21 |
| 5,892,244 | A | * | 4/1999 | Tanaka et al. | 257/40 |
| 6,291,258 | B2 | * | 9/2001 | Kadota | 438/46 |
| 6,673,478 | B2 | * | 1/2004 | Kato et al. | 428/698 |
| 7,145,174 | B2 | * | 12/2006 | Chiang et al. | 257/59 |
| 7,192,802 | B2 | * | 3/2007 | Stecker et al. | 438/57 |
| 7,223,641 | B2 | * | 5/2007 | Maekawa | 438/149 |
| 7,285,501 | B2 | * | 10/2007 | Mardilovich et al. | 438/763 |
| 2003/0214229 | A1 | * | 11/2003 | Holman | 313/505 |
| 2004/0023432 | A1 | * | 2/2004 | Haga | 438/104 |
| 2005/0150773 | A1 | * | 7/2005 | Yamada et al. | 205/199 |
| 2007/0287221 | A1 | * | 12/2007 | Ong et al. | 438/104 |

FOREIGN PATENT DOCUMENTS

WO    WO 99/50889    10/1999

OTHER PUBLICATIONS

E. Fortunato et al., "Fully Transparent ZnO Thin-Film Transistor Produced at Room Temperature," *Adv. Mater.*, vol. 17, No. 5, pp. 590-594 (Mar. 8, 2005).
T. E. Park et al., "Structural and Optical Properties of ZnO Thin Films Grown by RF Magnetron Sputtering on Si Substrates," *J. Korean Phys. Soc.*, vol. 45, pp. S697-S700 (Dec. 2004).
B. J. Norris et al., "Spin coated zinc oxide transparent transistors," *J. Phys. D: Appl. Phys.*, vol. 36, pp. L105-L107 (2003).
B. Sun et al., "Solution-Processed Zinc Oxide Field-Effect Transistors Based on Self-Assembly of Colloidal Nanorods," *Nano Lett.*, vol. 5, No. 12, pp. 2408-2413 (2005).

(Continued)

*Primary Examiner* — Matthew C Landau
*Assistant Examiner* — Colleen E Snow
(74) *Attorney, Agent, or Firm* — Zosan S. Soong; Fay Sharpe LLP

(57) ABSTRACT

An electronic device including: (a) a semiconductor layer including crystalline zinc oxide; and (b) an electrode including a suitable amount of zinc, indium, or a mixture thereof.

9 Claims, 3 Drawing Sheets

OTHER PUBLICATIONS

Y. Takahashi et al, "Photoconductivity of Ultrathin Zinc Oxide Films," *Jpn. J. Appl. Phys.*, vol. 33, pp. 6611-6615 (1994).

D. Bao et al., "Sol-gel derived c-axis oriented ZnO thin films," *Thin Solid Films*, vol. 312, pp. 37-39 (1998).

M. Ohyama et al., "Preparation of ZnO Films with Preferential Orientation by Sol-Gel Method," *J. Cer. Soc. Jpn.*, vol. 104, pp. 296-300 (1996).

S. Fujihara et al., "Crystallization behavior and origin of c-axis orientation in sol-gel-derived ZnO:Li thin films on glass substrates," *Appl. Sur. Sci.*, vol. 180, pp. 341-350 (2001).

K. Nishio et al., "Preparation of highly oriented thin film exhibiting transparent conduction by the sol-gel process," *J. Mater. Sci.*, vol. 31, pp. 3651-3656 (1996).

\* cited by examiner

DEVICE HAVING ZINC OXIDE SEMICONDUCTOR AND INDIUM/ZINC ELECTRODE

CROSS-REFERENCE TO RELATED APPLICATIONS

Beng S. Ong et al., U.S. application Ser. No. 11/450,998, filed Jun. 12, 2006, titled FABRICATION PROCESS FOR CRYSTALLINE ZINC OXIDE SEMICONDUCTOR LAYER, the disclosure of which is totally incorporated herein by reference.

BACKGROUND OF THE INVENTION

Zinc oxide is a promising channel semiconductor in electronic devices such as thin film transistors ("TFTs") for fabricating low cost TFT circuits for large area displays and other low cost electronics. It is generally desirable that TFTs have high field-effect mobility. Thus, there is a need addressed by embodiments of the present invention for TFTs containing a zinc oxide semiconductor layer with high field-effect mobility.

The following documents provide background information:

PCT International Publicaton Number WO 99/50889.

E. Fortunato et al., "Fully Transparent ZnO Thin-Film Transistor Produced at Room Temperature," *Adv. Mater.*, Vol. 17, No. 5, pp. 590-594 (Mar. 8, 2005).

T. E. Park et al., "Structural and Optical Properties of ZnO Thin Films Grown by RF Magnetron Sputtering on Si Substrates," *J. Korean Phys. Soc.*, Vol. 45, pp. S697-S700 (December 2004).

B. J. Norris et al., "Spin coated zinc oxide transparent transistors," *J. Phys. D: Appl. Phys.*, Vol. 36, pp. L105-L107 (2003).

B. Sun et al., "Solution-Processed Zinc Oxide Field-Effect Transistors Based on Self-Assembly of Colloidal Nanorods," *Nano Lett.*, Vol. 5, No. 12, pp. 2408-2413 (2005).

Y. Takahashi et al, "Photoconductivity of Ultrathin Zinc Oxide Films," *Jpn. J. Appl. Phys.*, Vol. 33, pp. 6611-6615 (1994).

D. Bao et al., "Sol-gel derived c-axis oriented ZnO thin films," *Thin Solid Films*, Vol. 312, pp. 37-39 (1998).

M. Ohyama et al., "Preparation of ZnO Films with Preferential Orientation by Sol-Gel Method," *J. Cer. Soc. Jpn.*, Vol. 104, pp. 296-300 (1996).

S. Fujihara et al., "Crystallization behavior and origin of c-axis orientation in sol-gel-derived ZnO:Li thin films on glass substrates," *Appl. Sur. Sci.*, Vol. 180, pp. 341-350 (2001).

K. Nishio et al., "Preparation of highly oriented thin film exhibiting transparent conduction by the sol-gel process," *J. Mater. Sci.*, Vol. 31, pp. 3651-3656 (1996).

SUMMARY OF THE DISCLOSURE

There is provided in embodiments an electronic device comprising:
(a) a semiconductor layer comprising crystalline zinc oxide; and
(b) an electrode comprising a suitable amount of zinc, indium, or a mixture thereof.

There is also provided in embodiments a thin film transistor comprising in any effective arrangement:
(a) a semiconductor layer comprising crystalline zinc oxide;
(b) a gate electrode;
(c) a source electrode;
(d) a drain electrode; and
(e) a gate dielectric,
wherein at least one of the source electrode and the drain electrode comprises a suitable amount of zinc, indium, or a mixture thereof.

There is provided in additional embodiments a process comprising:
fabricating a thin film transistor comprising in any effective arrangement a semiconductor layer, a gate dielectric, a gate electrode, a source electrode, and a drain electrode, wherein at least one of the source electrode and the drain electrode comprises a suitable amount of zinc, indium, or a mixture thereof,
wherein the semiconductor layer is formed by a semiconductor fabrication process comprising: liquid depositing one or more zinc oxide-precursor compositions and forming the semiconductor layer comprising crystalline zinc oxide from the liquid deposited one or more zinc oxide-precursor compositions.

BRIEF DESCRIPTION OF THE DRAWINGS

Other aspects of the present invention will become apparent as the following description proceeds and upon reference to the following figures which represent illustrative embodiments.

Unless otherwise noted, the same reference numeral in different Figures refers to the same or similar feature.

DETAILED DESCRIPTION

Figure 1:
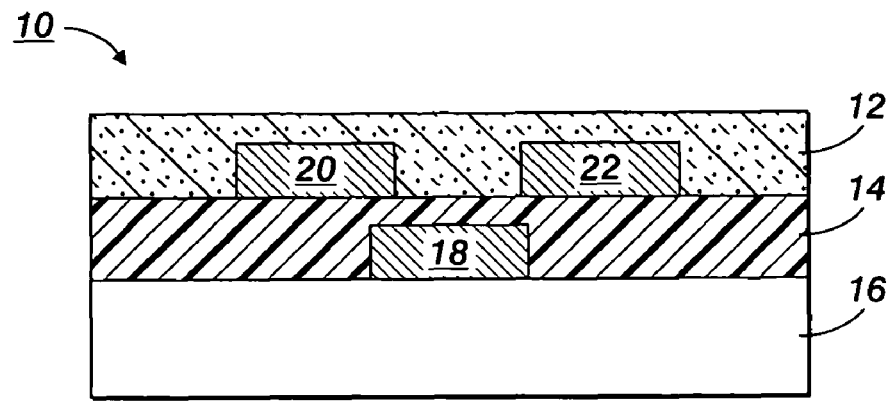
FIG. 1 represents a first embodiment of a TFT made according to the present disclosure.

It is understood that the terms "zinc" and "indium" (in contrast to a zinc compound and an indium compound) refer respectively to zinc atoms and indium atoms uncombined with other elements, that is, "elemental zinc" and "elemental indium."

In embodiments, the present process involves fabricating high mobility zinc oxide semiconductor layer(s) in TFTs by depositing a zinc oxide-precursor composition, followed by a heat treatment at a temperature (e.g., below about 550° C.), which is compatible with commonly used substrates (e.g., a Corning 7059 glass has a deformation temperature of 593° C. and can be used as the substrate for active matrix liquid crystal displays at a processing temperature below 600° C.). In embodiments, the resulting semiconductor layer has a preferential zinc oxide crystal orientation with c-axis perpendicular to the plane of semiconductor layer. In embodiments, the mobility of TFTs fabricated using the present process may be more than about 1 cm$^2$/V.s., exceeding most of TFTs fabricated by other liquid deposition techniques. In embodiments, the semiconductor layer has a preferential zinc oxide crystal orientation other than c-axis perpendicular to the plane of semiconductor layer. For example, in photovoltaic devices where the charge transport direction is vertical to the semiconductor layer, the semiconductor layer has a preferential zinc oxide crystal orientation with c-axis parallel to the plane of the semiconductor layer.

In the present process, one, two, or more semiconductor layers may be fabricated. Each semiconductor layer may result from one, two, or more liquid deposition coatings of a zinc oxide-precursor composition. Whether one semiconductor layer or multiple semiconductor layers are formed depends on a number of factors including for example the zinc oxide precursor composition(s), the heating conditions, and the number of occurrences of the various process features (a), (b), and (c). In embodiments involving multiple semiconductor layers, each semiconductor layer can differ from each in for example chemical composition, crystalline orientation, and/or degree of crystallinity.

Zinc oxide thin film crystal usually has a Wurtzite structure with lattice parameters a=3.2960 and c=5.2065 Å. The orientation of the zinc oxide can be analyzed using for example x-ray diffraction (XRD) technique. For randomly oriented zinc oxide crystals, three peaks can be observed with d-spacing distance of d=2.81, 2.60, 2.48 Å for (100), (002), and (101) plane, respectively, by using Cu Kα radiation (λ1.5418 Å). The intensity ratios of these peaks in a randomly oriented zinc oxide powder sample are respectively about $I_{(100)}/I_{(002)}/I_{(101)}$=57/44/100 (intensities are obtained from ICDD/JCPDS card No. 36-1451 provided by The International Centre for Diffraction Data®). For randomly oriented zinc oxide crystals, the percentage of the intensity of the (002) peak relative to the sum of intensities of (100), (002), and (101) peak, $I_{(100)}+I_{(002)}+I_{(101)}$, $I_{(002)}/[I_{(100)}+I_{(002)}+I_{(101)}] \times 100\%$, is about 22%±2%.

In embodiments, the crystalline zinc oxide in the semiconductor layer is preferentially oriented with the c-axis perpendicular to the plane of the semiconductor layer. In embodiments, this preferential orientation refers to the crystalline zinc oxide in the semiconductor layer having a percentage of x-ray diffraction intensity of the (002) peak relative to the sum of intensities of (100), (002), and (101) peak, $I_{(002)}/[I_{(100)}+I_{(002)}+I_{(101)}] \times 100\%$, larger than about 40%, larger than about 60%, larger than about 80% (or from about 40% to about 100%, from about 60% to about 100%, from about 80% to about 100%).

The zinc oxide precursor compositions with different types of components or with the same components but different concentrations are herein considered different from each other.

In embodiments, the deposited composition (that is, resulting from the liquid depositing) may have the same components as the zinc oxide-precursor composition used for the liquid depositing and may or may not differ in concentration of the components (certain liquid deposition techniques possibly may cause some evaporation/removal of the components).

Any suitable process can be used to fabricate the present electronic device. For instance, fabrication of the electronic device can be accomplished by liquid depositing one or more zinc oxide-precursor compositions and forming the semiconductor layer comprising crystalline zinc oxide from the liquid deposited one or more zinc oxide-precursor compositions. An illustrative process comprises: (a) liquid depositing a zinc-oxide precursor composition to result in a deposited composition; (b) heating the deposited composition; and (c) cooling the heated deposited composition. Features (b) heating and (c) cooling illustrate "forming the semiconductor layer comprising crystalline zinc oxide from the liquid deposited one or more zinc oxide-precursor compositions." The features (a), (b), and (c) are each accomplished, one, two, or more times in "any effective arrangement." To illustrate the meaning of "any effective arrangement," the following examples are provided of illustrative sequences:

(a) + (b) + (c);

(a) + (a) + (b) + (c);

(a) + (b) + (c) + (a) + (b) + (c);

(a) + (b) + (c) + (a) + (b) + (c) + (a) + (b) + (c);

(a) + (b) + (c) + (a) + (b) + (c) + (a) + (b) + (c) + (a) + (b) + (c);

(a) + (b) + (c) + (a) + (b) + (c) + (a) + (b) + (c) + (a) + (b) + (c);

(a) + (b) + (a) + (b) + (a) + (b) + (c);

(a) + (b) + (c) + (a) + (b) + (a) + (b) + (c);

(a) + (b) + (c) + (b) + (c);

(a) + (b) + (c) + (b) + (c) + (b) + (c);

(a) + (b) + (c) + (b) + (c) + (a) + (b) + (c).

The following discussion pertains to embodiments involving multiple occurrences of feature (a), feature (b), and/or feature (c). The zinc oxide precursor composition used in each feature (a) may be the same or different from each other. The heating conditions (e.g., heating temperature profile) in each occurrence of feature (b) may be the same or different from each other. The cooling conditions (e.g., cooling temperature profile) in each occurrence of feature (c) may be the same or different from each other.

The following describes embodiments involving the number of occurrences of particular process sequences. The number of the sequence "(a)+(b)+(c)" is for instance from 1 to 20, from 1 to 10, from 1 to 5, and particularly from 1 to 3. The number of the sequence "(a)+(b)" (that is, additional to the sequence "(a)+(b)+(c)") is for example from 0 to 10, from 0 to 5, and particularly from 0 to 2. The number of the sequence "(b)+(c)" (that is, additional to the sequence "(a)+(b)+(c)") is for instance from 0 to 10, from 0 to 5, and particularly from 0 to 2. The sum of the sequences "(a)+(b)+(c)," "(a)+(b)," and "(b)+(c)" is from 1 to 20, from 1 to about 10, and particularly from 1 to 6.

In embodiments, the zinc oxide precursor composition comprises starting ingredients including a zinc compound, an optional complexing agent, and a solvent.

The zinc compound is selected for example from the group consisting of zinc acetate, zinc formate, zinc oxalate, zinc nitrate, zinc propionate, zinc acetylacetonate, zinc acrylate, zinc methacrylate, zinc chloride, poly(ethylene-co-acrylic acid) zinc salt, their hydrate forms, and the like, and mixtures thereof. One or more other elements such as aluminum, indium, tin, copper, nickel, lithium, sodium, molybdenum, niobium, titanium, gallium, antimony, selenium, sulfur, boron, etc., can be incorporated by mixing compounds containing these elements with the zinc compound in the zinc oxide-precursor composition. The one or more other elements described above can also be incorporated by using zinc compounds that comprise the one or more other elements such as for example zinc sulfate, zinc sulfite, ethylenediaminetetraacetic acid zinc disodium salt, cobalt/barium/zinc octoate blends, zinc borate, zinc molybdate, zinc niobate, their hydrate forms, and the like, and mixtures thereof. The amount of such other elements in the zinc oxide-precursor composition is for instance about 0.001 mol % to about 50 mol %, from about 0.01 mol % to about 10 mol %, and particularly from 0.1 mol % to about 5 mol %, relative to zinc.

A complexing agent is optionally used which has the possible benefits of increasing the viscosity of zinc oxide precursor composition to improve thin film uniformity, and facilitating the formation of the preferential orientation of zinc oxide crystals with c-axis perpendicular to the resulting semiconductor layer. The complexing agent can be for example a carboxylic acid and an organoamine.

In embodiments, the complexing agent is an organoamine selected for example from the group consisting of ethanolamine, aminopropanol, diethanolamine, 2-methylaminoethanol, N,N-dimethylaminoethanol, methoxyethylamine, methoxypropylamine, diaminoethane, diaminopropane, diaminobutane, diaminocyclohexane, and the like, and mixtures thereof.

The solvent is selected for example from the group consisting of water, methanol, ethanol, propanol, butanol, pentanol, hexyl alcohol, heptyl alcohol, ethyleneglycol, methoxyethanol, ethoxyethanol, methoxypropanol, ethoxypropanol, methoxybutanol, dimethoxyglycol, N,N-dimethylformamide, and the like, and mixtures thereof.

The concentration of the zinc oxide precursor composition is for example from about 0.01 M to about 5 M (mole per liter), from about 0.02 M to about 2 M, and particularly from about 0.05 M to about 1 M, based on the starting ingredient zinc compound. The molar ratio of the complexing agent to zinc compound is for instance from about 0.1 to about 10, from about 0.2 to about 5, and particularly from about 0.5 to about 2.

Liquid depositing the zinc oxide precursor composition can be accomplished by any liquid deposition techniques such as for instance spin coating, blade coating, rod coating, screen printing, ink jet printing, stamping and the like.

In embodiments, the heating (that is, feature (b)) refers to a heat treatment at a temperature or several temperatures within a range of between about 100° C. and about 700° C. The heating is accomplished at a maximum temperature for example from about 200° C. to about 600° C., particularly from about 300° C. to about 550° C. The heating can be accomplished for example in an instant heating manner at a certain temperature using a pre-heated heating equipment. In embodiments, the heating can be accomplished in a gradual heating manner with a heating rate that the heating equipment can achieve, ranging from for example from about 0.5 to about 100° C. per minute starting from room temperature (about 25° C.) or starting from a temperature between about 25° C. to about 100° C. In further embodiments, the heating can also be accomplished step-wise at several temperatures, such as, for example, at about 300° C., then at about 400° C., and then at about 500° C. In embodiments, the heating can also be accomplished step-wise at several temperatures, combined with gradual heating such as, for example, at about 300° C. for about 30 min, then gradually increase to about 400° C. at a heating rate of about 10° C./min, and then at about 400° C. for about 30 min. The heating can also be accomplished for instance at a higher temperature and then at a lower temperature such as first at about 500° C. and then at about 400° C.

In embodiments, "cooling" refers to bringing the temperature of the deposited composition to a temperature below about 100° C., and particularly to about room temperature (that is, about 25° C.). The cooling can be accomplished for instance in a self-cooling manner by turning off the heating equipment or in a controlled manner at a certain cooling rate such as for example from about 0.1° C./min to about 100° C./min. In embodiments, a slow cooling such as at a cooling rate of about 0.1° C./min to about 10° C./min may be employed especially from a temperature higher than about 300° C. to reduce mechanical strain in the semiconductor layer(s) and the substrate.

The preferential orientation of the crystalline zinc oxide (with c-axis for instance perpendicular to the semiconductor layer) and the percentage of zinc oxide crystals with c-axis for instance perpendicular to the semiconductor layer depend for instance on the zinc oxide precursor composition(s) and heating conditions.

The zinc oxide precursor compositions and thin film fabrication procedures disclosed in afore-mentioned publications are totally incorporated herein by reference.

Illustrative zinc oxide precursor compositions are for example the following: zinc acetate/diethanolamine/isopropanol (Y. Takahashi et al, "Photoconductivity of Ultrathin Zinc Oxide Films," *Jpn. J. Appl. Phys.*, Vol. 33, pp. 6611-6615 (1994)), zinc acetate/lactic acid/ethanol (D. Bao et al., "Sol-gel derived c-axis oriented ZnO thin films," *Thin Solid Films*, Vol. 312, pp. 37-39 (1998)), zinc acetate/ethanoamine or diethanolamine)/methoxyethanol (M. Ohyama et al., "Preparation of ZnO Films with Preferential Orientation by Sol-Gel Method," *J. Cer. Soc. Jpn.*, Vol. 104, pp. 296-300 (1996); S. Fujihara et al., "Crystallization behavior and origin of c-axis orientation in sol-gel-derived ZnO:Li thin films on glass substrates," *Appl. Sur. Sci.*, Vol. 180, pp. 341-350 (2001)), zinc acetate/ethanolamine or acetylacetonate)/ethanol (K. Nishio et al., "Preparation of highly oriented thin film exhibiting transparent conduction by the sol-gel process," *J. Mater. Sci.*, Vol. 31, pp. 3651-3656 (1996)), the disclosures of the publications cited for their illustrative zinc oxide precursor compositions are totally incorporated herein by reference.

Embodiments of the present process include the following illustrative materials and procedures: zinc acetate/ethanolamine/alcohol as the zinc oxide precursor composition; zinc acetate/ethanolamine/methoxyethanol as the zinc oxide precursor composition; zinc acetate/ethanolamine/methoxyethanol as the zinc oxide precursor composition and an instant heating using a pre-heated heating equipment at a temperature at about 300° C. to about 600° C.; zinc acetate/ethanolamine/methoxyethanol as the zinc oxide precursor composition and instant heating using a pre-heated heating equipment at a temperature between about 350° C. to about 550° C.

The present zinc oxide semiconductor layer(s) can be used in electronic devices such as for example photovoltaic devices, large area displays, radio-frequency identification (RFID) tags, etc. In embodiments, the electronic devices include thin film transistors with high field-effect mobility of for example greater that ~$10^{-1}$ cm$^2$/V.s.

In FIG. 1, there is schematically illustrated an TFT configuration 10 comprised of a substrate 16, in contact therewith a metal contact 18 (gate electrode) and a layer of a gate dielectric layer 14 on top of which two metal contacts, source electrode 20 and drain electrode 22, are deposited. Over and between the metal contacts 20 and 22 is a zinc oxide semiconductor layer 12 as illustrated herein.

Figure 2:
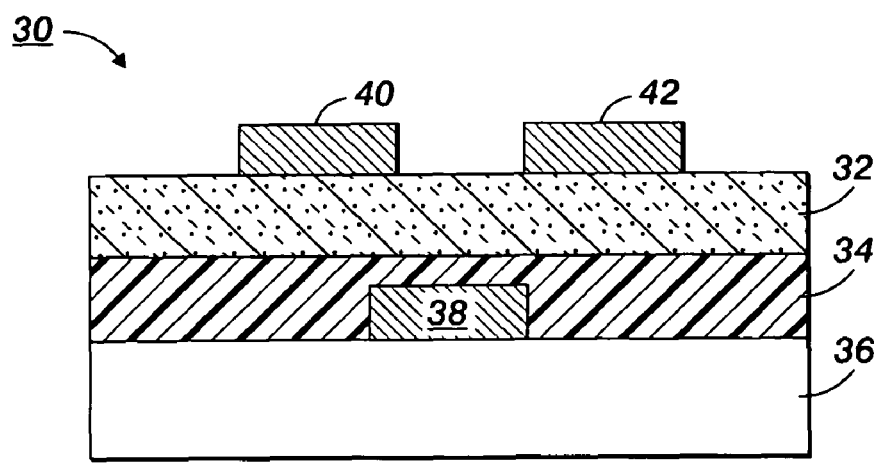
FIG. 2 represents a second embodiment of a TFT made according to the present disclosure.

FIG. 2 schematically illustrates another TFT configuration 30 comprised of a substrate 36, a gate electrode 38, a source electrode 40 and a drain electrode 42, a gate dielectric layer 34, and a zinc oxide semiconductor layer 32.

Figure 3:
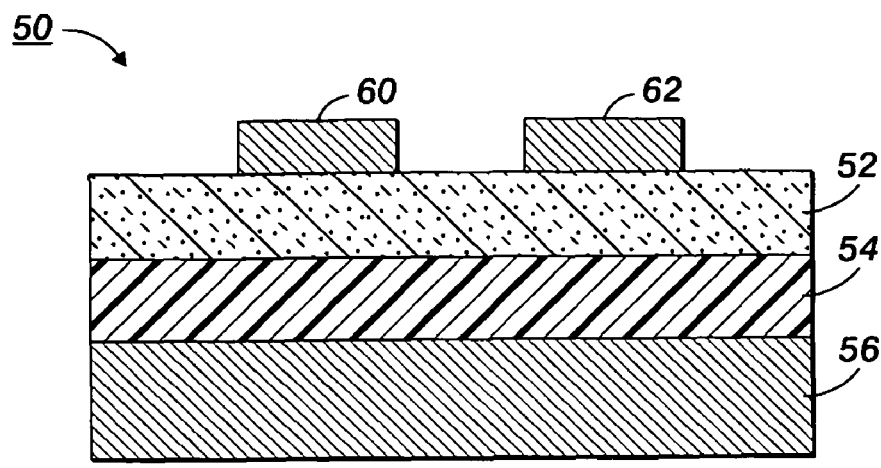
FIG. 3 represents a third embodiment of a TFT made according to the present disclosure.

FIG. 3 schematically illustrates a further TFT configuration 50 comprised of substrate (not shown)/indium-tin oxide (ITO)/an aluminum-titariium oxide (ATO), wherein the ITO 56 is a gate electrode, and ATO 54 is a dielectric layer, and a zinc oxide semiconductor layer 52, on top of which are deposited a source electrode 60 and a drain electrode 62.

Figure 4:
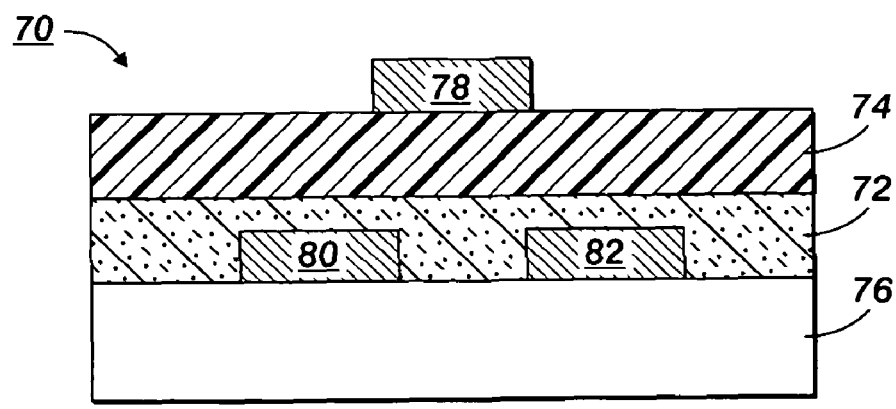
FIG. 4 represents a fourth embodiment of a TFT made according to the present disclosure.

FIG. 4 schematically illustrates an additional TFT configuration 70 comprised of substrate 76, a gate electrode 78, a source electrode 80, a drain electrode 82, a zinc oxide semiconductor layer 72, and a gate dielectric layer 74.

The composition and formation of the zinc oxide semiconductor layer are described herein.

The zinc oxide semiconductor layer has a thickness ranging for example from about 10 nanometers to about 1 micrometer, particularly a thickness of from about 20 to about 200 nanometers. The TFT devices contain a semiconductor channel with a width, W and length, L. The semiconductor channel width may be, for example, from about 0.1 micrometers to about 5 millimeters, with a specific channel width being about 5 micrometers to about 1 millimeter. The semiconductor channel length may be, for example, from about 0.1 micrometer to about 1 millimeter with a more specific channel length being from about 5 micrometers to about 100 micrometers.

The substrate may be composed of any suitable materials for instance silicon, glass, aluminum, or plastics. The thickness of the substrate may be from about 10 micrometers to over 10 millimeters with a representative thickness being from about 1 to about 10 millimeters for a rigid substrate such as glass plate or silicon wafer.

The gate electrode can be a thin metal film, a conducting polymer film, a conducting film made from conducting ink or paste or the substrate itself, for example heavily doped silicon. Examples of gate electrode materials include but are not restricted to metals in elemental form such as aluminum, nickel, gold, silver, copper, zinc, indium, metal oxides such as zinc-gallium oxide, indium tin oxide, indium-antimony oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAG™ available from Acheson Colloids Company. The gate electrode can be prepared by vacuum evaporation, sputtering of metals or conductive metal oxides, coating from conducting polymer solutions or conducting inks by spin coating, casting or printing. The thickness of the gate electrode ranges for example from about 10 to about 200 nanometers for metal films and in the range of about 1 to about 10 micrometers for polymer conductors.

Preferred materials suitable for use as source and/or drain electrodes are zinc, indium, and a mixture thereof. In addition to zinc, indium, or a mixture thereof, the source and drain electrodes can further optionally include other suitable materials (including those described herein for the gate electrode) such as for example aluminum, copper, nickel, silver, gold, conductive metal oxides (e.g., zinc-gallium oxide, indium tin oxide, indium-antimony oxide), conducting polymers such as polystyrene sulfonate-doped poly(3,4-ethylenedioxythiophene) (PSS-PEDOT), and the like, and mixtures thereof. The term "mixture" encompasses for instance an "alloy" comprising two or more metals as well as mixtures of organic and inorganic substances. In a mixture, the substances are present in any suitable equal or unequal molar ratio such as for example 50:50.

The source and drain electrode can be single layered or multi-layered (e.g., two, three or more layers). For a multi-layered source/drain electrode, each layer can comprise the material(s) described herein; in embodiments, the electrode layer closest to the semiconductor layer comprises zinc, indium, or a mixture thereof, and optionally other material(s). Exemplary multi-layered source/drain electrodes are Zn/Cu, Zn/Al, Zn/Ni, Zn/Ag, Zn/ITO, Zn/Al/Cu, Zn/Cr/Cu, In/Cu, In/Al, In/ITO, In/Al/Cu, and the like. Typical thicknesses of source and drain electrodes are about, for example, from about 20 nanometers to about 1 micrometer with the more specific thickness being about 40 to about 400 nanometers. For multi-layered source and drain electrodes, the thickness of the layer comprising zinc, indium, or a mixture thereof can be for example from about 1 nanometer to about 500 nanometers with more specific thickness being about 5 nanometers to 200 nanometers.

The electrode layer(s) comprising zinc, indium, or a mixture thereof, in the source and drain electrodes can be deposited by any suitable deposition techniques such as for example vacuum evaporation, chemical vapor deposition (CVD), plasma sputtering, and liquid deposition using organo- or inorganometallic compounds (as described in H. Takamatsu, U.S. Pat. No. 6,197,366 B1, which is totally incorporated herein by reference), and the like, or the combination of them. For multi-layered source and drain electrodes, the layer(s) other than the layer(s) comprising zinc, indium, or a mixture thereof can be deposited by any suitable deposition techniques such as for example vacuum evaporation, chemical vapor deposition (CVD), plasma sputtering, and liquid deposition using polymeric conductive inks, metal particle dispersions, or organo- or inorganometallic compounds. Liquid deposition of gold and silver nanoparticle dispersions are described in Y. Wu, et al., "High-Performance Organic Thin-Film Transistors with Solution-Printed Gold Contacts," *Adv. Mater.*, Vol. 17, No. 2, pp. 184-187 (Jan. 31, 2005) and Y. Li, et al., "Facile Synthesis of Silver Nanoparticles Useful for Fabrication of High-Conductivity Elements for Printed Electronics," *J. Am. Chem. Soc.*, Vol. 127, No. 10, pp. 3266-3267 (published on Web Feb. 18, 2005); liquid deposition of organo- or inorganometallic compounds are described in H. Takamatsu, U.S. Pat. No. 6,197,366 B1.

The electrode layer(s) comprising zinc, indium, or a mixture thereof may optionally contain other materials such as conductors such as for example silver, gold, aluminum, ITO, etc.; semiconductors such as for example zinc oxide, tin oxide, etc.; and insulators such as aluminum oxide, silicon oxide, etc. A suitable amount of the zinc, indium, or a mixture thereof is present in the electrode layer(s). "Suitable amount" refers to an amount more than a trace amount. To illustrate "suitable amount" of the zinc, indium, or a mixture thereof, at least one or both of the source electrode and the drain electrode has a surface area contacting the semiconductor layer that comprises the zinc, the indium, or the mixture thereof in about 10% to 100% (or about 40% to 100%) of the electrode contact surface area. Any suitable method can be used to determine the amount of zinc, indium, or the mixture thereof in the electrode contact surface area such as for example Auger Electron Microscopy, X-Ray Photoelectron Spectroscopy, and Electron Spectroscopy for Chemical Analysis. In the event of significant variations in measured values among the methods, Auger Electron Microscopy is preferred.

The gate dielectric layer generally can be an inorganic material film or an organic polymer film. Illustrative examples of inorganic materials suitable as the gate dielectric layer include aluminum-titanium oxide, aluminum oxide, silicon oxide, silicon nitride, barium titanate, barium zirconium titanate and the like; illustrative examples of organic polymers for the gate dielectric layer include polyesters, polycarbonates, poly(vinyl phenol), polyimides, polystyrene, poly(methacrylate)s, poly(acrylate)s, epoxy resin and the like. The thickness of the gate dielectric layer is, for example from about 10 nanometers to about 2000 nanometers depending on the dielectric constant of the dielectric material used. A representative thickness of the gate dielectric layer is from about 100 nanometers to about 500 nanometers. The gate dielectric layer may have a conductivity that is for example less than about $10^{-12}$ S/cm.

In embodiments, the gate dielectric layer, the gate electrode, the semniconductor layer, the source electrode, and the drain electrode are formed in any sequence with the gate electrode and the semiconductor layer both contacting the gate dielectric layer, and the source electrode and the drain electrode both contacting the semiconductor layer. The phrase "in any sequence" includes sequential and simultaneous formation. For example, the source electrode and the drain electrode can be formed simultaneously or sequentially.

For a n-channel TFT, the source electrode is grounded and a bias voltage of generally, for example, about 0 volt to about 80 volts is applied to the drain electrode to collect the charge carriers transported across the semiconductor channel when a voltage of generally about −20 volts to about +80 volts is applied to the gate electrode.

In embodiments, the zinc oxide semiconductor layer in a TFT device generally exhibits a field-effect mobility of greater than for example about 1 cm$^2$/Vs (square centimeter per Volt per second), and an on/off ratio of greater than for example about $10^3$. On/off ratio refers to the ratio of the source-drain current when the transistor is on to the source-drain current when the transistor is off.

The invention will now be described in detail with respect to specific embodiments thereof, it being understood that these examples are intended to be illustrative only and the invention is not intended to be limited to the materials, conditions, or process parameters recited herein. All percentages and parts are by weight unless otherwise indicated.

Example 1

A 0.05M-0.2 M solution of zinc acetate in a mixture of ethanolamine and methoxyethanol (with Zn/amine=1 molar ratio) was first prepared by adding methoxyethanol to a mixture of zinc acetate dihydrate dihydrate (1.10 g, 5 mmol) and ethanolamine (0.32 g, 5 mmol), followed by heating at 60° C. for 1 hr to dissolve the solid.

Figure 5:
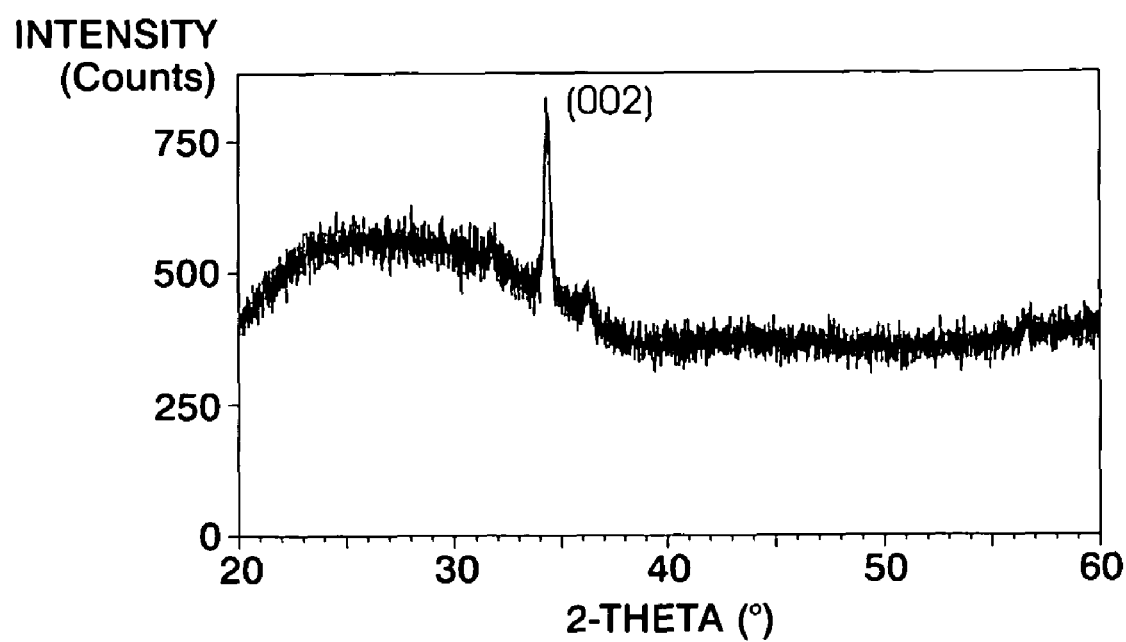
FIG. 5 shows the X-ray diffraction measurement results of the ZnO thin film prepared according to Example 1.

ZnO thin film on SiO$_2$/Si wafer was prepared similarly and subject to X-ray diffraction (XRD) measurement. FIG. 5 shows the XRD results of the ZnO thin film heated in a pre-heated oven at about 400° C. for about 30 min. The thin film was measured at room temperature on a Rigaku MiniFlex Diffractometer using Cu Kα radiation (λ1.5418 Å) with a θ-2θ scans configuration. FIG. 5 indicates that the ZnO crystals have a preferential orientation with c-axis (002) perpendicular to the substrate. The calculated $I_{(002)}/[I_{(100)}+I_{(002)}+I_{(101)}]\times 100\%$ is about 80%, indicating that the crystalline zinc oxide is preferentially oriented with the c-axis perpendicular to the plane of the ZnO thin film.

A TFT device having the configuration of FIG. 3 was prepared as follows. A glass substrate coated with an indium-tin oxide (ITO) layer and an aluminum-tin oxide (ATO, 100 nm) top layer was first cleaned with oxygen plasma and then drop-coated with a 0.05 M zinc acetate solution, spun on a spin-coater at a speed of 1000 rpm for 2 minutes, and then heated on a hot plate at 180° C. for 30 min. It was then placed in a pre-heated oven at 500° C. for 30 min. The coating and heating procedures were repeated twice using respectively 0.1 M and 0.2 M zinc acetate solutions. Finally, an array of source-drain electrode pairs using various metals (see Table 1) with channel length of 90 micron and channel width of 5000 micron were vacuum-evaporated on top of the ZnO layer to form ZnO TFTs.

The TFT performance was evaluated using a Keithley 4200 SCS semiconductor characterization system. The field-effect mobility in the saturated regime, μ, was calculated according to equation (1)

$$I_{SD}=C_i\mu(W/2L)(V_G-V_T)^2 \quad (1)$$

where $I_{SD}$=drain current at the saturated regime, W and L are respectively channel width and length, $C_i$ is the capacitance per unit area of the gate dielectric layer, and $V_G$ and $V_T$ are respectively gate voltage and threshold voltage. The transfer and output characteristics of the devices showed that ZnO was an n-type semiconductor. Using transistors with a dimension of W=5,000 μm and L=90 μm, the following average properties were obtained and summarized in Table 1.

TABLE 1

FET properties of ZnO TFTs using different electrode materials.

| Source/drain electrodes | Mobility, cm$^2$V$^{-1}$s$^{-1}$ | Current on/off ratio |
| --- | --- | --- |
| Gold (Au) | ~10$^{-4}$ | — |
| Tin (Sn) | ~10$^{-4}$ | — |
| Aluminum (Al) | 1.0-1.5 | ~10$^4$ |
| Zinc (Zn) | 3.0-5.2 | ~10$^4$ |
| Indium (In) | 7.0-20 | ~10$^4$ |

Based on the results in Table 1, using zinc and indium as source and drain electrode materials provides much high electron mobility than using a number of other conductive materials.

It will be appreciated that various of the above-disclosed and other features and functions, or alternatives thereof, may be desirably combined into many other different systems or applications. Various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

The invention claimed is:

1. A process comprising:
    fabricating a thin film transistor comprising in any effective arrangement a semiconductor layer, a gate dielectric, a gate electrode, a source electrode, and a drain electrode, wherein at least one of the source electrode and the drain electrode comprises a suitable amount of zinc, indium, or a mixture thereof, wherein the semiconductor layer is formed by a semiconductor fabrication process comprising: liquid depositing one or more zinc oxide-precursor compositions and forming the semiconductor layer comprising polycrystalline zinc oxide from the liquid deposited one or more zinc oxide-precursor compositions; and
    wherein the semiconductor layer fabrication process further comprises heating the deposited composition and cooling the heated deposited composition; and wherein the zinc oxide precursor composition comprises a zinc compound, a solvent, and a complexing agent selected from the group consisting of a carboxylic acid and an organoamine.

2. The process of claim 1, wherein the polycrystalline zinc oxide is preferentially oriented with the c-axis perpendicular to the plane of the semiconductor layer.

3. The process of claim 1, wherein the source electrode and the drain electrode are a single layer.

4. The process of claim 1, wherein at least one of the source electrode and the drain electrode has a surface area contacting the semiconductor layer that comprises the zinc, the indium, or the mixture thereof in about 10% to 100% of the electrode contact surface area.

5. The process of claim 1, wherein the at least one of the source electrode and the drain electrode comprises indium.

6. The process of claim 1, wherein at least one of the source electrode and the drain electrode is fabricated by a method comprising vacuum evaporation, chemical vapor deposition, or plasma sputtering, or liquid deposition of a dispersion.

7. The process of claim 1, wherein the thin film transistor has a field-effect mobility of greater than about $0.3 \text{ cm}^2\text{V}^{-1}\text{s}^{-1}$.

8. The process of claim 1, wherein the thin film transistor has a field-effect mobility of greater than about $5 \text{ cm}^2\text{V}^{-1}\text{s}^{-1}$.

9. The process of claim 1, wherein the thin film transistor has a field-effect mobility of greater than about $10 \text{ cm}^2\text{V}^{-1}\text{s}^{-1}$.

* * * * *